United States Patent [19]
Kurtz et al.

[11] Patent Number: 5,455,445
[45] Date of Patent: * Oct. 3, 1995

[54] MULTI-LEVEL SEMICONDUCTOR STRUCTURES HAVING ENVIRONMENTALLY ISOLATED ELEMENTS

[75] Inventors: Anthony D. Kurtz, Teaneck; Alexander A. Ned, Bloomingdale, both of N.J.

[73] Assignee: Kulite Semiconductor Products, Inc., Leonia, N.J.

[*] Notice: The portion of the term of this patent subsequent to Jan. 31, 2002 has been disclaimed.

[21] Appl. No.: 185,112

[22] Filed: Jan. 21, 1994

[51] Int. Cl.$^6$ .......................... H01L 29/84; H01L 29/40; H01L 29/08
[52] U.S. Cl. ....................... 257/419; 257/698; 257/750; 257/777
[58] Field of Search .......................... 257/67, 74, 278, 257/419, 756, 777, 734, 741, 750, 508, 690, 692, 693, 698, 704, 774; 437/915

[56] References Cited

U.S. PATENT DOCUMENTS

| | | | |
|---|---|---|---|
| 4,786,954 | 11/1988 | Morie et al. | 257/303 |
| 4,972,248 | 11/1990 | Kornreich et al. | 257/278 |
| 5,266,833 | 11/1993 | Capps | 257/690 |

FOREIGN PATENT DOCUMENTS

| | | | |
|---|---|---|---|
| 0037953 | 3/1983 | Japan | 257/67 |
| 0130670 | 5/1992 | Japan | 257/419 |

OTHER PUBLICATIONS

*Journal of the Electrochemical Society*, vol. 139, No. 12, by C. Oules, A. Halimaoui, J. L. Fegolini, A Perio and G. Bomchil, Dec., 1992, pp. 3595–3598.

*Primary Examiner*—William Mintel
*Assistant Examiner*—Peter Toby Brown
*Attorney, Agent, or Firm*—Plevy & Associates

[57] ABSTRACT

A plurality of individual device layers having conductive regions extending therethrough are bonded together before or after one or more circuit elements have been fabricated on each one. Groups of device layers are formed by electrochemically anodizing a wafer of semiconductor material. The wafer is rendered totally porous except for a series of non-porous regions extending therethrough. The wafer is then oxidized and densified to result in a wafer having a plurality of electrically isolated extended contacts. A plurality of wafers are processed in this manner. A variety of integrated circuit devices are then formed on the surface of each wafer. The ability to separately fabricate each wafer obviates trying to incorporate various incompatible processes (required by each device type) on just one wafer surface. Once the processing of all individual wafers is completed, each wafer is bonded to another at appropriate areas, with the extending contact aligned to electrically interconnect each device layer. The wafers are then diced to provide a plurality of multi-level integrated circuit structures.

9 Claims, 3 Drawing Sheets

MULTI-LEVEL SEMICONDUCTOR STRUCTURES HAVING ENVIRONMENTALLY ISOLATED ELEMENTS

REFERENCE TO RELATED APPLICATIONS

There are several co-pending applications, each of which are assigned to Kulite Semiconductors, Inc., the assignee herein, and each of which relate to the fabrication of semiconductor devices utilizing porous semiconductive materials. Reference is made herein to the following co-pending applications: U.S. patent application Ser. No. 07/957,519 filed on Oct. 6, 1992 and entitled POROUS SILICON CARBIDE AND RELATED METHODS AND APPARATUS, now U.S. Pat. No. 5,298,767 issued Mar. 29, 1994 and U.S. patent application Ser. No. 08/058,016, filed on May 7, 1993, and entitled SEMICONDUCTOR STRUCTURES HAVING ENVIRONMENTALLY ISOLATED ELEMENTS AND METHOD FOR MAKING THE SAME, now U.S. Pat. No. 5,386,142 issued Jan. 31, 1995.

BACKGROUND OF THE INVENTION

The present invention relates generally to three dimensional integrated circuits. More particularly, the present invention relates to a specific configuration for three dimensional integrated circuits and a method of fabricating the same.

In order to increase circuit density, semiconductor manufacturers have continued to reduce the size of various integrated circuit elements and interconnections to the point where the limits of current technology are being reached. It would, therefore be desirable to provide a multi-level integrated chip of very small dimensions with large amounts of electronic devices than are currently feasible.

Accordingly, it is an object of the present invention to provide a multi-level chip whose individual layers may be fabricated independently of one another and bonded together after all incompatible processing steps have been performed.

SUMMARY OF THE INVENTION

A three dimensional integrated circuit structure fabricated in accordance with the present invention comprises a first device layer, which first device layer defines an electrically conductive pad of semiconductor material, and a second device layer which defines at least one electrically isolated conductive region of semiconductor material extending between opposed surfaces thereof. Preferably, the first device layer includes at least one integrated circuit device which is received in a cavity formed on a surface of the second layer. If desired, the cavity may be hermetically sealed, and may even be configured as a vacuum cavity.

The conductive pad may either be provided as an element disposed on a surface of the first layer or as a conductive region which extends through the first layer. In the latter embodiment, the structure further comprises a third layer of semiconductor material, the third layer defining a second conductive pad coupled to the conductive region of the first layer. In this manner, the first, second, and third layers, and any individual circuit elements associated therewith, may be electrically interconnected. In the illustrative embodiment, the conductive regions are comprised of p-type monocrystalline silicon. It will, however, be readily appreciated by those skilled in the art that any suitable semiconductive material may be used and that the same may be doped n- or p-type as desired.

BRIEF DESCRIPTION OF THE DRAWINGS

The above-mentioned and other features and objects of the present invention and the manner of obtaining them will become apparent and the invention itself will be best understood by reference to the following description of an embodiment of the invention taken in conjunction with the accompanying drawings, wherein.

DETAILED DESCRIPTION OF THE INVENTION

The present invention will now be described more fully hereinafter with reference to the accompanying drawings, in which an illustrative embodiment of the present invention is shown. This invention may, however, be embodied in many different forms and should not be construed as limited to the embodiment set forth herein. Rather, applications provide this embodiment so that this disclosure will be thorough and complete, and will fully convey the scope of the invention to those skilled in the art.

Figure 1:
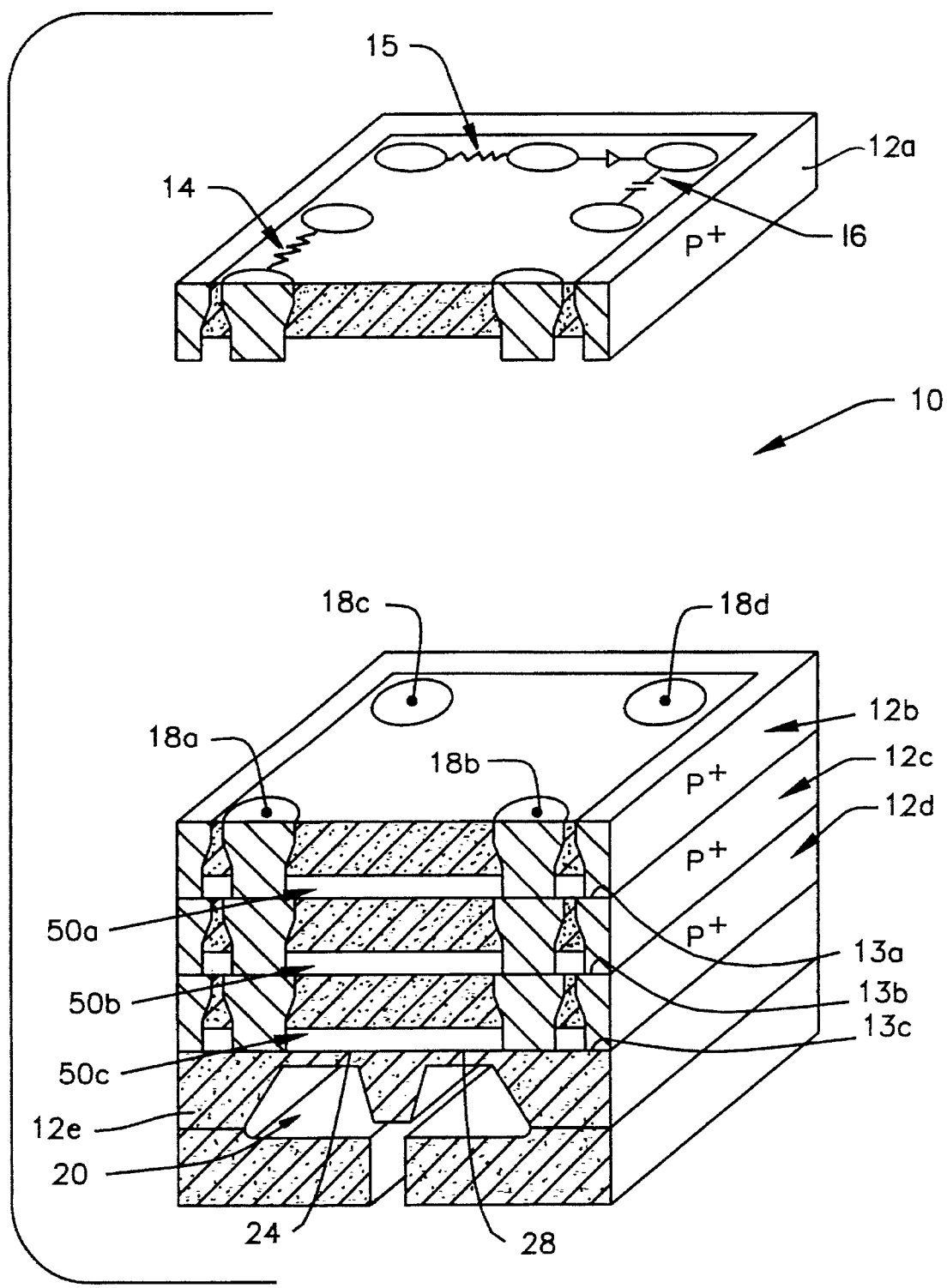
FIG. 1 is an exploded perspective view of an illustrative embodiment of a three dimensional integrated circuit structure fabricated in accordance with the present invention.

Referring to FIG. 1, a three dimensional integrated circuit chip structure 10 fabricated in accordance with the present invention is shown in exploded perspective view for ease of understanding. As seen in FIG. 1, the structure 10 comprises a plurality of individual integrated circuit device layers 12a–12e which are superposed and bonded together at layer bond interfaces 13a–13c to form a unitary structure. The bonding of the device layers can be accomplished by using glass bonding, electrostatic glass bonding; or any other well known technique. Fabricated on a surface of at least one of the device layers are one or more circuit devices as 14, 15, and 16 of upper layer 12a. As can be seen in FIG. 1, each device layer further comprises one or more electrical contacts as 18a–18d of layer 12b, which contacts extend through the thickness thereof to form an electrically conductive path therethrough. The respective contacts of intermediate device layer 12b are bonded to corresponding aligned contacts of an overlying or underlying device layer. Cavities 50a–50c receive the one or more circuit devices of an underlying device layer. Thus, as will be readily ascertained by those skilled in the art that any desired number of device layers may be interconnected in this manner to provide a densely arranged, three dimensional structure having conductive pathways extending therethrough.

As will be appreciated by those skilled in the art, various combinations of devices may be incorporated in the device layers. In the illustrative embodiment of FIG. 1, the bottom device layer 12e is configured as a pressure sensor device having a diaphragm 20 and having sensor elements 24 and 28 fabricated thereon. Any conventional technique for fabricating such a sensor device layer may be utilized. Reference may be had, for example, to U.S. patent application Ser. No. 08/058,016 entitled SEMICONDUCTOR ISOLATED STRUCTURES HAVING ENVIRONMENTALLY ISOLATED ELEMENTS AND METHOD FOR MAKING THE SAME and filed on May 7, 1993, which application is assigned to the assignee herein, Kulite Semiconductor Products, Inc. and which application is herein expressly incorporated in its entirety by reference. As seen in FIG. 1, device layer 12e further includes electrical contacts 30a and 30b bonded to contacts 29a and 29b, respectively, of device layer 12d. In this manner, the conductive path defined in device layers 12a–12c extends to the surface of sensor layer 12d, thereby providing electrical contact with the sensor elements thereof.

With reference now to FIGS. 2A–2G, a method for fabricating one of the plurality of device layers 12 which comprise the novel structure depicted in FIG. 1 will now be described. Essentially, extended contacts will be formed in each device layer in accordance with a technique such as that described in the aforementioned U.S. application Ser. No. 08/058,016. Thus, with initial reference to FIG. 2A, there is shown a p-type wafer of low resistivity silicon 32, the back surface 34 of which is contacted by a conductive metal pad 36 which will form an ohmic contact. It will, of course, be apparent to those skilled in the art that any suitable semiconductive material may be utilized and that while the illustrative wafer 32 is doped with p-type impurities, it may also be doped n-type as required by the application.

Figure 2A:
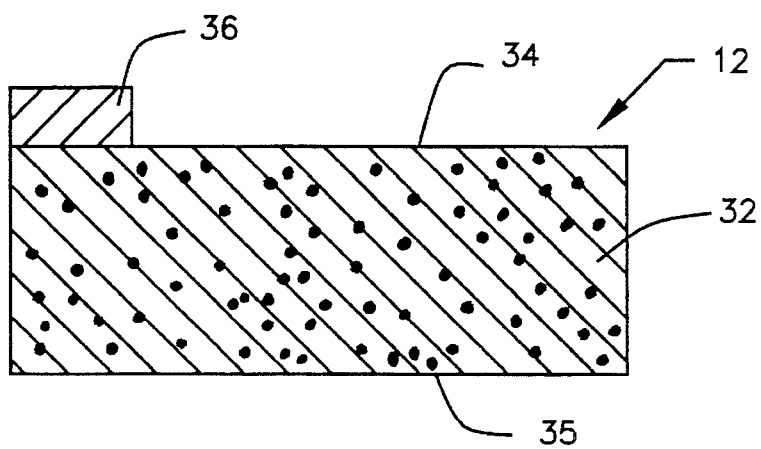
FIGS. 2A–2G are a series of view depicting a method of fabricating one of a plurality of device wafers which, when bonded together, may be utilized to fabricate a three dimensional integrated circuit structure in accordance with the present invention.
Figure 2B:
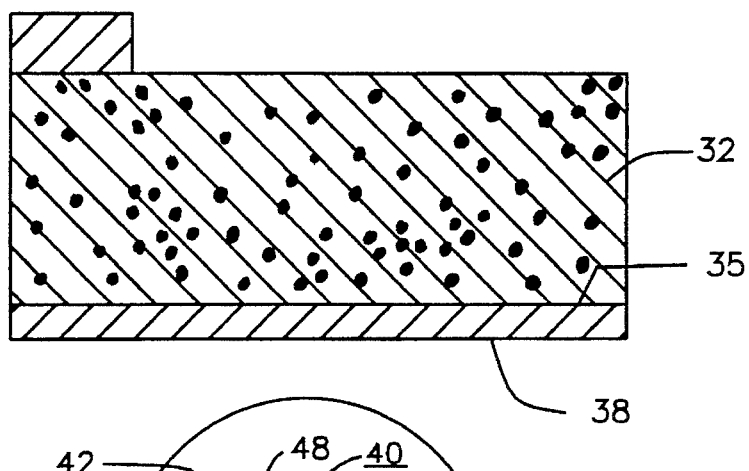
Figure 2C:
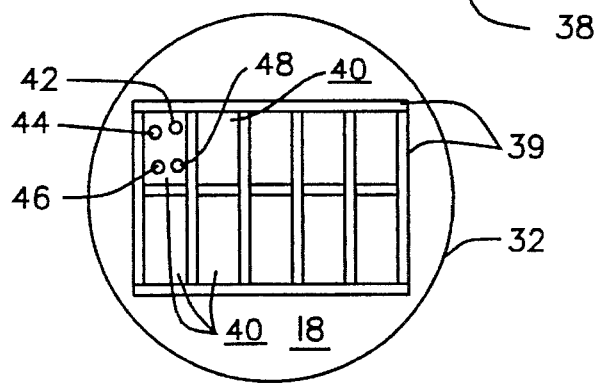

The front surface 35 of p-type silicon wafer 32 is treated or coated to form an etching mask layer 38 thereon (FIG. 2B). The mask layer may be formed of silicon nitride and may be applied by any known method (e.g., by sputtering). A layer of photoresist (not shown) is then deposited on top of the mask layer. The layer of photoresist is patterned to form a resistive pattern over the mask layer. This is done by a conventional photolithography technique and is well known. A plan view of the resultant pattern is shown in FIG. 2C after etching the unwanted portions of the mask layer. The patterned portions of the mask layer comprise a grid of intersecting line portions 39 which define a plurality of rectangular areas 40. Within each rectangular area 40 are additional masked portions 42, 44, 46 and 48 whose positions will determine the locations of the extended contacts which will be formed in the wafer.

Figure 2D:
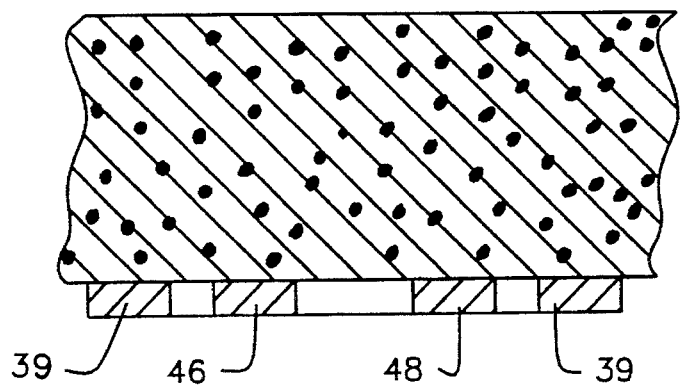
Figure 2E:
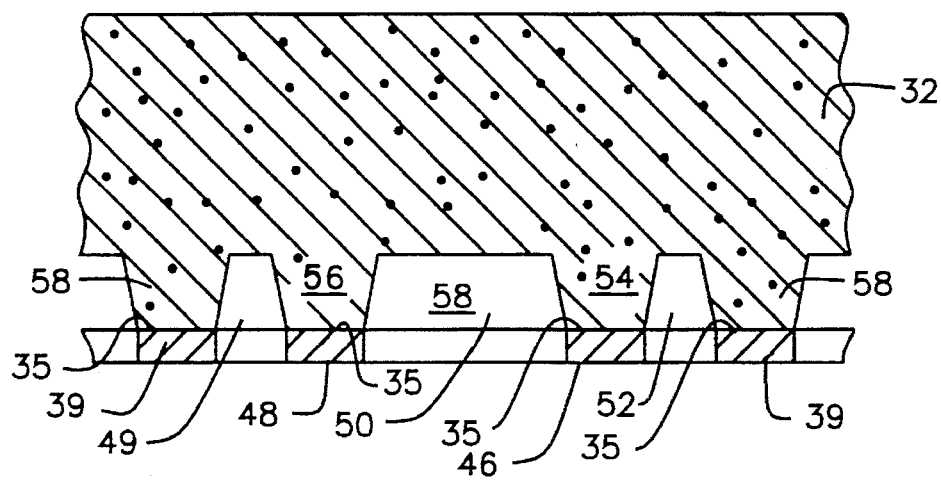
Figure 2F:
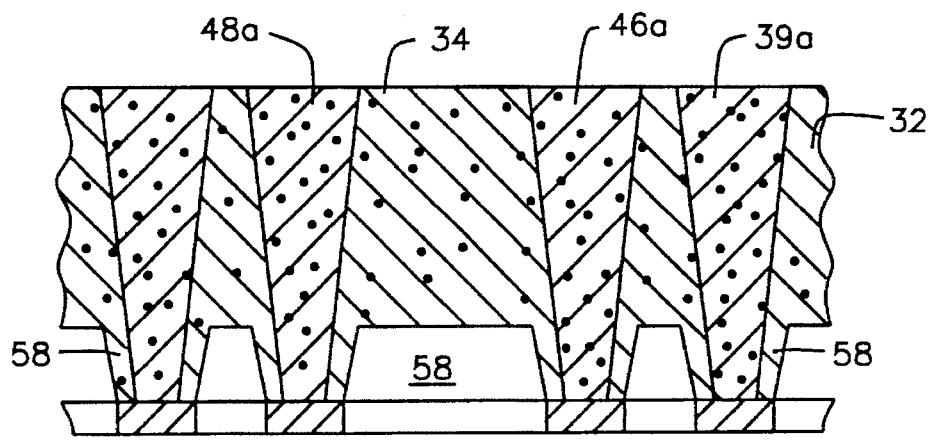

A cross sectional view of a portion of first wafer 32 showing one rectangular area 40 and the masked portions thereof is illustrated in FIGS. 2D–2F. It will, of course, be appreciated that the process steps discussed below may, be modified with respect to any of the rectangular areas 40, since the locations of the contacts being formed in each area will depend upon the specific circuit configuration desired. As shown in FIG. 2E, trenches 49, 50 and 52 are formed on the front surface 35 of wafer 32. The location of central trench 50 is selected so that it may be aligned with circuit elements of another chip, thereby defining a cavity which receives the circuit elements. The positions of the remaining trenches determine the shape and location of contact projections 54 and 56, and a projecting rim portion 58 which circumscribes each rectangular area 40. The trenches, which may be 5–10 m deep, can be formed by a conventional etching process using a selective etchant which will not attack the mask layer 38. For example, if silicon nitride is used to form the mask layer, potassium hydroxide may be utilized as the etchant since it will etch silicon without affecting silicon nitride.

Once the pattern of trenches has been established, porous silicon regions are formed in the wafer 32 in accordance with the method disclosed in the aforementioned U.S. application Ser. No. 08/058016. Thus, as shown in FIG. 2F, the entire thickness of the anodized silicon wafer 32 is made porous in areas which were exposed to an electrolytic solution. The back surface 34, and masked areas 39a, 46a and 48a between the front surface and the back surface remain non-porous and monocrystalline.

Figure 2G:
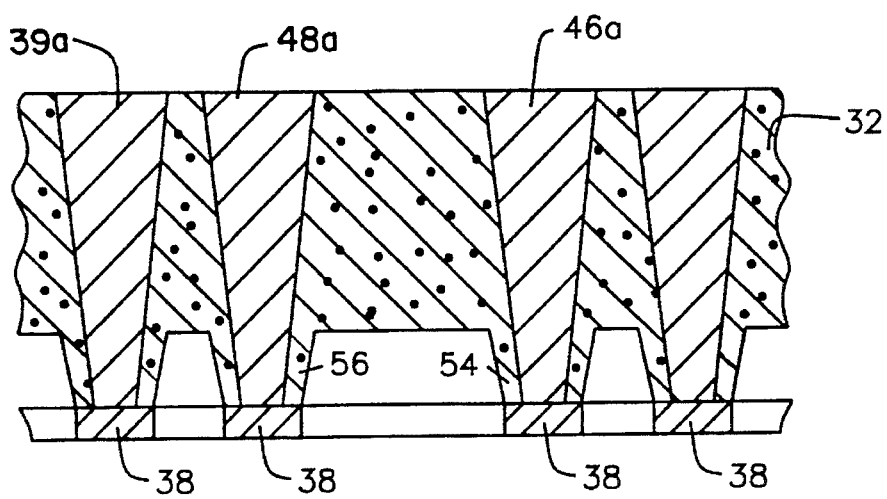

Once the first wafer 32 has been electrochemically anodized to create the configuration of porous and non-porous regions of silicon shown in FIG. 2F, it is subjected to a thermal oxidization process. During the oxidation process all porous areas of silicon are converted to silicon dioxide while the silicon nitrate masks the monocrystalline silicon areas from the oxidation. Processes which convert porous silicon to silicon dioxide are well known in the art. One such process is described in an article by C. Oules et al appearing in the Journal of the Electrochemical Society, Volume 139, No. 12 (1992). As disclosed in the Oules et al article, the oxidized regions of porous silicon can be densified by heating it in an oxygen ambient, thereby resulting in a continuous (i.e. non-porous) layer of silicon dioxide. A silicon dioxide wafer 12 having regions of monocrystalline p-type silicon 39a, 46a, and 48a obtained in the above described manner is shown in FIG. 2G. The mask layer 38 is then removed using a suitable etchant, such as hot phosphoric acid in the case of a silicon nitride mask, which will not attack the silicon dioxide or silicon.

At this point, individual circuit devices (not shown) are fabricated on the surface of wafer 32 within each rectangular area 40 in a manner known to those skilled in the art. The above processing steps are repeated until a plurality of device wafers, each comprising a number of rectangular areas representing respective device layers of a three dimensional integrated circuit structure, have been formed. It will therefore be appreciated by those skilled in the art that the respective device wafers may be separately processed so that the individual devices of particular three dimensional integrated structures as 10 need not be subjected to those high temperature fabrication steps applicable only to one or a few of them.

Once all the wafers have been fabricated and have their appropriate circuitry defined on them, they may be bonded together utilizing any conventional bonding technique. A suitable technique which may be utilized is disclosed in U.S. Pat. No. 5,286,671 issued Feb. 15, 1994, entitled FUSION BONDING TECHNIQUE FOR USE IN FABRICATING SEMICONDUCTOR DEVICES and assigned to the assignee herein, which application is expressly incorporated by reference in its entirety. Prior to bonding, the wafers are arranged so that the respective contacts of adjacent wafer are aligned and in contact with one another and so that the individual circuit devices are received within a corresponding trench, or cavity as 50 (FIG.2E). The composite structure (not shown) may then be scribed to separate the plurality of transducers or other circuits into individual circuit assemblies, such as the one depicted in FIG. 1. Thus, a great number of three dimensional individual circuit devices may be obtained via the above described common processing procedure.

It should be understood that the embodiment described herein, including the type of semiconductive materials used and the technique for bonding the respective device wafers, is merely exemplary and that a person skilled in the art may make many variations and modifications to the described embodiments utilizing functionally equivalent elements to those described. For example, some extended contact device wafers can be bonded to other such wafers prior to patterning and fabricating circuit devices thereon. Moreover, by utilizing a suitable bonding technique as the one described herein, it is possible to provide hermetic, non-hermetic, and vacuum cavities between each device layer, depending upon the requirements of a given application. Any such variations or modifications to the invention just described, as well as others which may become apparent to those skilled in the art, are intended to be included within the scope of said invention as defined by the appended claims.

What is claimed is:

1. A semiconductor structure comprising:

a first device layer, having at least one electrically conductive interconnection of semiconductor material extending between opposing surfaces thereof, said at least one electrically conductive interconnection defining a first electrically conductive pad and one of said opposing surfaces defining a cavity;

a second device layer having at least one electrically conductive interconnection of semiconductor material extending between opposed surfaces thereof, said at least one electrically conductive interconnection contacting said first conductive pad of said first device layer; and a third device layer of semiconductor material defining a second conductive pad coupled to said at least one electrically conductive interconnection in said first device layer, said third layer having at least one integrated circuit device comprising a pressure sensitive transducer on a surface thereof, said cavity of said first device layer accommodating said pressure sensitive transducer on said third layer in order to substantially prevent physical contact between said pressure sensitive transducer and said first device layer, whereby said first, second, and third device layers are electrically interconnected.

2. The structure according to claim 1, wherein said first electrically conductive pad is disposed on one of said opposed surfaces of said first device layer.

3. The structure according to claim 1, wherein each of said at least one electrically conductive interconnections is comprised of monocrystalline silicon.

4. A semiconductor structure comprising:

at least three semiconductor wafers coupled together, at least two of said at least three wafers each having electrically conductive interconnections of monocrystalline semiconductor material extending between opposed surfaces thereof, at least one of said at least three semiconductor wafers having a semiconductor element disposed on a surface thereof, said semiconductor element being accommodated in a cavity defined in an adjacent one of said at least three wafers having said electrically conductive interconnections in order to substantially prevent physical contact between said semiconductor element and said adjacent one of said at least three wafers, and wherein said electrically conductive interconnections of said at least two of said at least three semiconductor wafers operating to electrically couple said at least three semiconductor wafers together.

5. The semiconductor device of claim 4, wherein said semiconductor material is silicon.

6. A semiconductor device comprising:

a first device wafer fabricated from a semiconductor material, said first device wafer having at least one semiconductor element formed on a surface thereof;

a second device wafer having first and second surfaces, said second device wafer being fabricated from said semiconductor material, said second device wafer having at least one semiconductor element formed on said first surface thereof, said second surface of said second device wafer being bonded to said surface of said first device wafer to hermetically seal said at least one semiconductor element of said first device wafer, said second device wafer having at least two electrically conductive interconnections of said semiconductor material extending between said first and second surfaces of said second device wafer, said at least two electrically conductive interconnections providing at least two electrical contacts on said first surface of said second device wafer for said at least one semiconductor element of said first device wafer and said at least one semiconductor element of said second device wafer; and a cover wafer having first and second surfaces, said cover wafer being fabricated from said semiconductor material, said second surface of said cover wafer being bonded to said first surface of said second device wafer to hermetically seal said at least one semiconductor element of said second device wafer, said cover wafer having at least two electrically conductive interconnections of said semiconductor material extending between said first and second surfaces thereof, said at least two electrically conductive interconnections of said cover wafer defining at least two electrical contacts on said first surface thereof, said at least two electrical contacts on said first surface of said second device wafer being coupled to said at least two electrically conductive interconnections of said cover wafer, said at least two electrical contacts of said cover wafer providing electrical contact for said at least one semiconductor element of said first device layer and said at least one semiconductor element of said second device layer.

7. The semiconductor device of claim 6, wherein said semiconductor material is silicon.

8. The semiconductor device of claim 7, wherein said silicon is monocrystalline.

9. The semiconductor device of claim 6, further comprising cavity means in said second device wafer and said cover wafer for enclosing each of said at least one semiconductor element.

* * * * *